(12) United States Patent
Pu et al.

(10) Patent No.: US 12,176,291 B2
(45) Date of Patent: Dec. 24, 2024

(54) ELECTRONIC PACKAGE AND MANUFACTURING METHOD THEREOF

(71) Applicant: SILICONWARE PRECISION INDUSTRIES CO., LTD., Taichung (TW)

(72) Inventors: Chao-Chiang Pu, Taichung (TW); Chi-Ching Ho, Taichung (TW); Yi-Min Fu, Taichung (TW); Yu-Po Wang, Taichung (TW); Shuai-Lin Liu, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 434 days.

(21) Appl. No.: 17/740,796

(22) Filed: May 10, 2022

(65) Prior Publication Data
US 2023/0282586 A1 Sep. 7, 2023

(30) Foreign Application Priority Data
Mar. 4, 2022 (TW) .................................. 111107998

(51) Int. Cl.
| H01L 21/00 | (2006.01) |
| H01L 23/48 | (2006.01) |
| H01L 23/538 | (2006.01) |
| H01L 25/00 | (2006.01) |
| H01L 25/10 | (2006.01) |
| H01L 23/00 | (2006.01) |

(52) U.S. Cl.
CPC ........ *H01L 23/5381* (2013.01); *H01L 23/481* (2013.01); *H01L 23/5386* (2013.01); *H01L 25/105* (2013.01); *H01L 25/50* (2013.01); H01L 23/5385 (2013.01); H01L 23/5389 (2013.01); H01L 24/16 (2013.01); H01L 24/32 (2013.01); H01L 24/73 (2013.01); H01L 2224/16227 (2013.01); H01L 2224/16235 (2013.01); H01L 2224/16237 (2013.01); H01L 2224/32225 (2013.01); H01L 2224/73204 (2013.01); H01L 2224/73253 (2013.01)

(58) Field of Classification Search
CPC ............... H01L 23/5381; H01L 23/481; H01L 23/5386; H01L 25/105
See application file for complete search history.

(56) References Cited

U.S. PATENT DOCUMENTS 11,094,637 B2 * 8/2021 Rubin ..................... H01L 24/32
11,127,699 B2 * 9/2021 Lin .................... H01L 23/49822
11,296,032 B2 * 4/2022 Tsou ................. H01L 23/49838
(Continued)

FOREIGN PATENT DOCUMENTS

CN 102177398 A * 9/2010 ............... E04B 9/32
CN 1659810 B * 4/2012 ....... H01L 23/49805
(Continued)

*Primary Examiner* — Laura M Menz
(74) *Attorney, Agent, or Firm* — Dority & Manning, P.A.

(57) ABSTRACT

An electronic package is provided in which a chip packaging module, an electronic element having a plurality of contacts, and an electronic connector are disposed on a routing structure of a carrier component, so as to communicatively connect with the chip packaging module via the electronic element and the electronic connector, thereby increasing a signal transmission speed.

18 Claims, 5 Drawing Sheets

(56) References Cited

U.S. PATENT DOCUMENTS

| | | | |
|---|---|---|---|
| 11,574,875 B2* | 2/2023 | Rubin | H01L 23/5385 |
| 11,728,234 B2* | 8/2023 | Lin | H01L 24/11 |
| | | | 257/737 |
| 12,014,967 B2* | 6/2024 | Lin | H01L 25/0652 |
| 12,027,484 B2* | 7/2024 | Chen | H01L 23/49838 |
| 12,068,211 B2* | 8/2024 | Lin | H01L 24/11 |
| 12,068,535 B2* | 8/2024 | Tang | H01Q 21/065 |
| 2019/0006309 A1* | 1/2019 | Jeng | H01L 24/20 |
| 2019/0057948 A1* | 2/2019 | Yang | H01L 25/0657 |
| 2019/0103353 A1* | 4/2019 | Liu | H01L 25/0655 |
| 2020/0058622 A1* | 2/2020 | Chen | H01L 24/73 |
| 2020/0328161 A1* | 10/2020 | Lin | H01L 21/4853 |
| 2021/0134728 A1* | 5/2021 | Rubin | H01L 21/4853 |
| 2021/0175161 A1* | 6/2021 | Park | H01L 23/13 |
| 2021/0225664 A1* | 7/2021 | Wu | H01L 23/5226 |
| 2021/0265275 A1* | 8/2021 | Rubin | H01L 23/5381 |
| 2021/0375768 A1* | 12/2021 | Tsou | H01L 23/49838 |
| 2022/0068779 A1* | 3/2022 | Kweon | H01L 24/48 |
| 2022/0068785 A1* | 3/2022 | Hong | H01L 25/105 |
| 2022/0084925 A1* | 3/2022 | Chen | H01L 25/18 |
| 2022/0359324 A1* | 11/2022 | Lin | H01L 21/56 |
| 2022/0392861 A1* | 12/2022 | Chen | H01L 23/49816 |
| 2023/0215808 A1* | 7/2023 | Chang | H01L 25/167 |
| 2023/0253331 A1* | 8/2023 | Fu | H01L 23/5381 |
| | | | 257/690 |
| 2023/0268262 A1* | 8/2023 | Chang | H01L 21/4857 |
| | | | 257/690 |
| 2023/0282586 A1* | 9/2023 | Pu | H01L 24/13 |
| | | | 257/690 |
| 2023/0282972 A1* | 9/2023 | Tang | H01Q 21/065 |
| | | | 343/700 R |
| 2023/0343663 A1* | 10/2023 | Lin | H01L 24/43 |
| 2023/0343664 A1* | 10/2023 | Lin | H01L 23/3107 |
| 2023/0343665 A1* | 10/2023 | Lin | H01L 24/11 |
| 2023/0369229 A1* | 11/2023 | Lin | H01L 21/486 |
| 2023/0378080 A1* | 11/2023 | Yu | H01L 23/5386 |
| 2023/0411364 A1* | 12/2023 | Huang | H01L 23/49816 |
| 2023/0420391 A1* | 12/2023 | Kao | H01L 23/564 |
| 2024/0014111 A1* | 1/2024 | Han | H01L 24/48 |
| 2024/0047420 A1* | 2/2024 | Chen | H01L 23/367 |
| 2024/0072019 A1* | 2/2024 | Ke | H01L 24/16 |
| 2024/0128249 A1* | 4/2024 | Chiu | H01L 25/162 |
| 2024/0153884 A1* | 5/2024 | Fu | H01L 24/16 |
| 2024/0170355 A1* | 5/2024 | Chiu | H01L 23/3114 |
| 2024/0222280 A1* | 7/2024 | Cho | H01L 21/565 |
| 2024/0258187 A1* | 8/2024 | Chen | H01L 21/6835 |
| 2024/0290674 A1* | 8/2024 | Lin | H01L 21/56 |
| 2024/0290675 A1* | 8/2024 | Lin | H01L 23/5286 |

FOREIGN PATENT DOCUMENTS

| | | | | |
|---|---|---|---|---|
| CN | 117038623 A | * | 11/2023 | ......... H01L 21/4821 |
| CN | 117038623 B | * | 8/2024 | ......... H01L 21/4821 |
| TW | 832571 B1 | * | 2/2024 | ......... H01L 23/3114 |
| WO | WO-2022251986 A1 | * | 12/2022 | |
| WO | WO-2023015972 A1 | * | 2/2023 | |

* cited by examiner

ELECTRONIC PACKAGE AND MANUFACTURING METHOD THEREOF

BACKGROUND

1. Technical Field

The present disclosure relates to a semiconductor device, and more particularly, to an electronic package with an electronic connector and a manufacturing method thereof.

2. Description of Related Art

With the evolution of semiconductor packaging technology, different packaging types have been developed for semiconductor devices. In order to improve electrical functions and save packaging space, different three-dimensional packaging technologies have been developed to integrate integrated circuits with different functions into a single package structure, for example, electronic elements with different functions (e.g., a memory, a central processing unit, a graphics processing unit, an image application processor, etc.) are integrated into a system by stacking design, which is applied to thin and light electronic products.

FIG. 1 is a schematic cross-sectional view of a conventional semiconductor package 1. The semiconductor package 1 comprises: a substrate structure 14 and a chip packaging module 1a disposed on the substrate structure 14, wherein the chip packaging module 1a includes a first encapsulant 15, a first semiconductor chip 11 embedded in the first encapsulant 15, a circuit structure 10 and a plurality of conductive elements 17 disposed on opposite sides of the first encapsulant 15, a plurality of conductive pillars 13 embedded in the first encapsulant 15 to electrically connect the circuit structure 10 and the conductive elements 17, a plurality of second semiconductor chips 12 disposed on the circuit structure 10, and a second encapsulant 16 covering the second semiconductor chips 12, so that the conductive elements 17 are connected onto the substrate structure 14. In addition, a heat sink 18 can be provided on an upper side of the substrate structure 14, and a plurality of solder balls 19 are formed on a lower side of the substrate structure 14 for bonding to a circuit board (not shown).

However, the conventional semiconductor package 1 is only provided with one chip packaging module 1a, so on the circuit board, the communication among the plurality of chip packaging modules 1a can only be electrically transmitted by the substrate structure 14, as a result, the transmission speed is quite slow, especially when the semiconductor package 1 is used in artificial intelligence (AI) related electronic products that require high data rate, gradually increasing bandwidth, and gradually reducing delay, etc., the inapplicability of the semiconductor package 1 will be more obvious.

Furthermore, as the package size of the semiconductor package 1 including high-performance computing (HPC) elements needs to increase, the communication between the chip packaging modules 1a is more difficult to meet operational requirements.

Therefore, how to overcome the above-mentioned drawbacks of the prior art has become an urgent issue to be solved at present.

SUMMARY

In view of the various deficiencies of the prior art, the present disclosure provides an electronic package, which comprises: a carrier component having a routing structure; a chip packaging module disposed on the carrier component and electrically connected to the routing structure; an electronic element having a plurality of contacts and disposed on the carrier component and electrically connected to the routing structure to receive electrical signals from the chip packaging module; and an electronic connector disposed on the carrier component and electrically connected to the routing structure to receive the electrical signals from the electronic element.

The present disclosure also provides a manufacturing method of an electronic package, which comprises: providing a carrier component having a routing structure; and disposing a chip packaging module, an electronic element having a plurality of contacts and an electronic connector on the carrier component, and electrically connecting the chip packaging module, the electronic element and the electronic connector to the routing structure, wherein the electronic element receives electrical signals from the chip packaging module, and the electronic connector receives the electrical signals from the electronic element.

In the aforementioned electronic package and the manufacturing method thereof, the routing structure includes a redistribution layer. For example, the routing structure further includes a dielectric layer, such that the redistribution layer is bonded with the dielectric layer.

In the aforementioned electronic package and the manufacturing method thereof, further comprising disposing the carrier component on a substrate structure.

In the aforementioned electronic package and the manufacturing method thereof, the carrier component includes a second packaging layer embedded with a plurality of second conductive pillars, such that the routing structure is disposed on the second packaging layer and electrically connected to the plurality of second conductive pillars. Further, the chip packaging module includes a first packaging layer embedded with a plurality of first conductive pillars. For example, the first packaging layer and the second packaging layer are disposed on opposite sides of the routing structure. In addition, the first packaging layer has a hardness greater than a hardness of the second packaging layer.

In the aforementioned electronic package and the manufacturing method thereof, the chip packaging module includes a bridging element.

In the aforementioned electronic package and the manufacturing method thereof, the electronic connector is provided with a signal transmission line for connecting to an external device.

As can be seen from the above, the electronic package of the present disclosure and the manufacturing method thereof mainly increases a signal transmission speed by communicatively connecting a second electronic element and an electronic connector to the chip packaging module, thereby avoiding the problem that the communication speed between multiple electronic packages is too slow. Therefore, compared with the prior art, in the present disclosure, on a circuit board, the communication between chip packaging modules on a plurality of electronic packages is electrically transmitted through the electronic connector, so as to increase the transmission speed. For instance, when the electronic package is applied to electronic products related to artificial intelligence (AI), which require high data rate, gradually increasing bandwidth, and gradually reducing time delay, the excellent applicability of the electronic package can be further highlighted.

Furthermore, as the package size of the electronic package including the high performance computing element needs to increase, the communication between the chip packaging modules can better meet the operational requirements.

DETAILED DESCRIPTIONS

The following describes the implementation of the present disclosure with examples. Those skilled in the art can easily understand other advantages and effects of the present disclosure from the contents disclosed in this specification.

It should be understood that, the structures, ratios, sizes, and the like in the accompanying figures are used for illustrative purposes to facilitate the perusal and comprehension of the contents disclosed in the present specification by one skilled in the art, rather than to limit the conditions for practicing the present disclosure. Any modification of the structures, alteration of the ratio relationships, or adjustment of the sizes without affecting the possible effects and achievable proposes should still be deemed as falling within the scope defined by the technical contents disclosed in the present specification. Meanwhile, terms such as "upper," "first," "second," "one" and the like used herein are merely used for clear explanation rather than limiting the practicable scope of the present disclosure, and thus, alterations or adjustments of the relative relationships thereof without essentially altering the technical contents should still be considered in the practicable scope of the present disclosure.

FIG. 2A to FIG. 2H are schematic cross-sectional views illustrating a manufacturing method of an electronic package 2 of the present disclosure.

Figure 1:
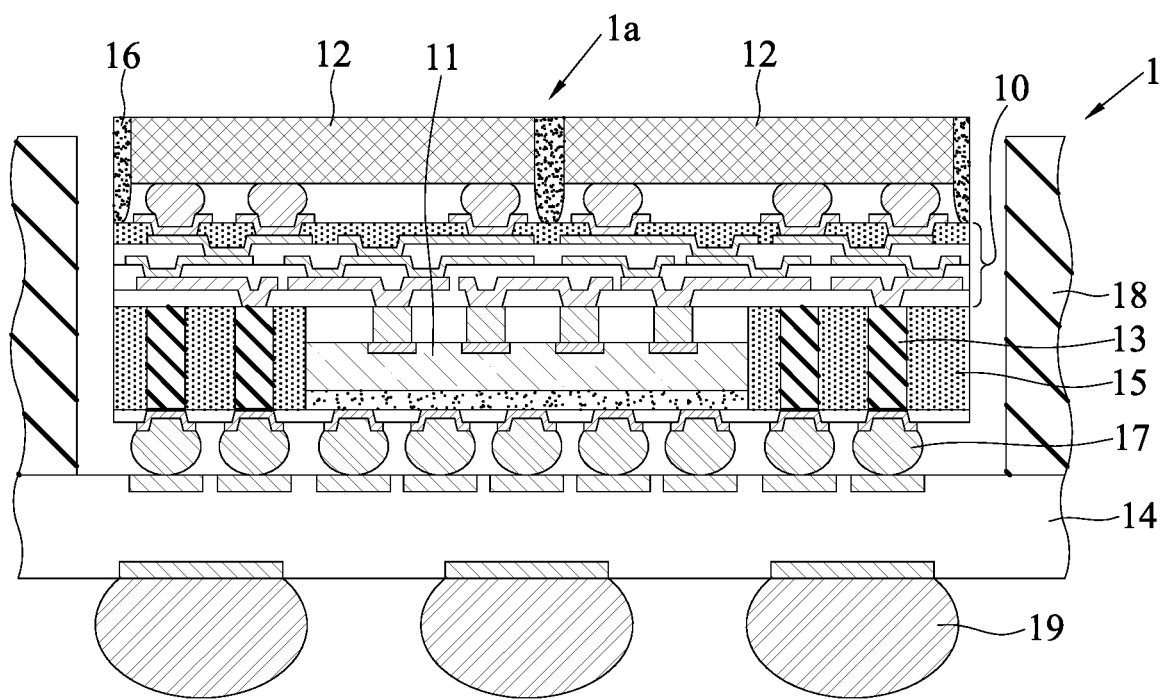
FIG. 1 is a schematic cross-sectional view of a conventional semiconductor package.
Figure 2A:
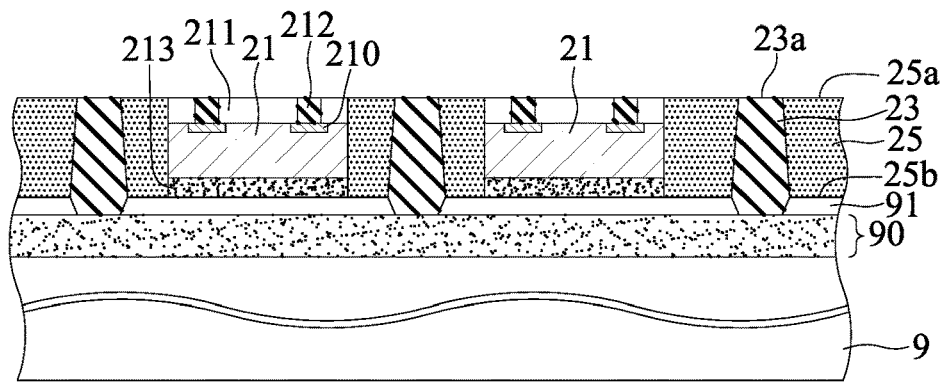
FIG. 2A to FIG. 2H are schematic cross-sectional views illustrating a manufacturing method of an electronic package according to the present disclosure.

As shown in FIG. 2A, a plurality of first conductive pillars 23 are formed on a carrier board 9 of a panel specification or a wafer level specification, and at least one first bridging element 21 (the embodiment shows a plurality of first bridging elements 21) is disposed on the carrier board 9. Next, a first packaging layer 25 is formed on the carrier board 9, so that the first packaging layer 25 covers the first bridging elements 21 and the first conductive pillars 23.

The carrier board 9 is, for example, a board of semiconductor material (such as silicon or glass), on which a release layer 90 and an insulating layer 91 such as a dielectric material or a solder resist are sequentially formed by, for example, coating.

The first bridging element 21 is a semiconductor chip, a bottom side of which is fixed on the insulating layer 91 by a bonding layer 213 such as a die attached film (DAF), a top side of which has a plurality of electrode pads 210 and a protective film 211 such as a passivation material, and each of the electrode pads 210 is provided with a conductor 212, so that the protective film 211 covers a plurality of conductors 212.

In an embodiment, the plurality of conductors 212 are conductive lines, spherical conductive members such as solder balls, or cylindrical metal conductive members such as copper posts, solder bumps, etc., or stud conductive members made by wire bonding machines, but not limited to these.

The first conductive pillars 23 are metal pillars such as copper pillars or pillars containing solder material, and the plurality of first conductive pillars 23 penetrate through the insulating layer 91.

The first packaging layer 25 has a first surface 25a and a second surface 25b opposite to each other, and upper surfaces of the protective film 211 and the plurality of conductors 212 and end surfaces 23a of the first conductive pillars 23 are exposed from the first surface 25a of the first packaging layer 25, and the second surface 25b of the first packaging layer 25 is bonded onto the insulating layer 91 of the carrier board 9.

In an embodiment, the first packaging layer 25 is an insulating material, such as polyimide (PI), dry film, encapsulant such as epoxy resin, or molding compound. For example, the first packaging layer 25 can be formed on the insulating layer 91 by liquid compound, injection, lamination, or compression molding.

Furthermore, the first surface 25a of the first packaging layer 25 can be flush with the upper surfaces of the protective film 211 and the plurality of conductors 212 and the end surfaces 23a of the first conductive pillars 23 by a leveling process, so that the protective film 211, the end surfaces 23a of the first conductive pillars 23 and the plurality of conductors 212 are exposed from the first surface 25a of the first packaging layer 25. For example, the leveling process removes partial materials of the protective film 211, partial materials of the first conductive pillars 23, partial materials of the plurality of conductors 212 and partial materials of the first packaging layer 25 by polishing.

Figure 2B:
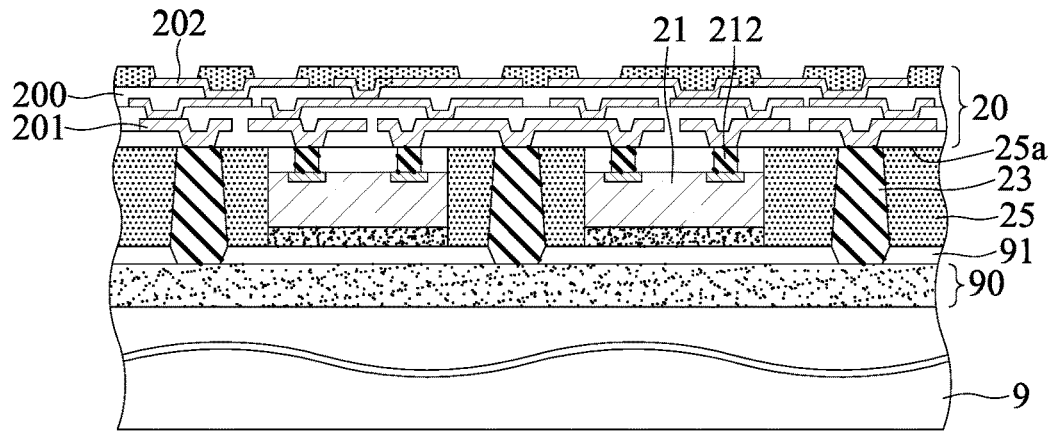

As shown in FIG. 2B, a circuit structure 20 is formed on the first surface 25a of the first packaging layer 25, and the circuit structure 20 is electrically connected to the plurality of first conductive pillars 23 and the plurality of conductors 212.

In an embodiment, the circuit structure 20 includes a plurality of insulating layers 200 and a plurality of redistribution layers (RDLs) 201 disposed on the insulating layers 200, wherein the outermost insulating layer 200 can be used as a solder mask, and the outermost redistribution layer 201 is exposed from the solder mask to serve as an electrical contact pad 202, such as a micro pad (μ-pad). Further, an Under Bump Metallurgy (UBM) layer (not shown) may be formed on the electrical contact pad 202. It should be understood that the circuit structure 20 may also include only a single insulating layer 200 and a single redistribution layer 201.

Furthermore, the material for forming the redistribution layer 201 is copper, and the material for forming the insulating layer 200 is dielectric materials such as polybenzoxazole (PBO), polyimide (PI), prepreg (PP), etc., or solder resist materials such as solder mask, graphite, etc.

Figure 2C:
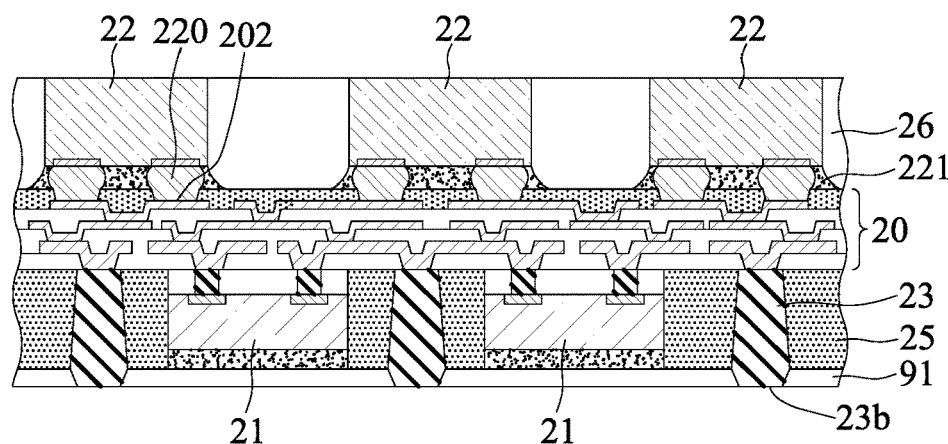

As shown in FIG. 2C, at least one first electronic element 22 is disposed on the circuit structure 20, so that the first electronic element 22 is electrically connected to the circuit structure 20 (the embodiment shows a plurality of first electronic elements 22). Next, the carrier board 9 and the release layer 90 thereon are removed, and the insulating layer 91 is retained, so that the end surfaces 23b of the first conductive pillars 23 are exposed from the insulating layer 91.

The first electronic element 22 is an active element, a passive element, or a combination of both, and the active element is such as a semiconductor chip, and the passive element is such as a resistor, a capacitor, or an inductor.

In an embodiment, the first electronic element 22 is, for example, an active element of a graphics processing unit (GPU), a high bandwidth memory (HBM) or other types of semiconductor chips, and the present disclosure is not limited as such. For example, the first electronic element 22 is electrically connected to the electrical contact pad 202 via a plurality of conductive bumps 220 such as solder bumps, copper bumps or others, and a cladding layer 26 can concurrently cover the first electronic element 22 and the conductive bumps 220.

Alternatively, an underfill 221 can first be formed between the first electronic element 22 and the circuit structure 20 to cover the conductive bumps 220, and then the cladding layer 26 can be formed to cover the underfill 221 and the first electronic element 22.

The cladding layer 26 is an insulating material, such as polyimide (PI), dry film, encapsulant such as epoxy resin, or molding compound, which can be formed on the circuit structure 20 by lamination or molding. It should be understood that the material for forming the cladding layer 26 may be the same or different from the material of the first packaging layer 25.

In an embodiment, partial materials of the cladding layer 26 can be removed by a leveling process, such as polishing, so that the upper surface of the cladding layer 26 is flush with the surface of the first electronic element 22, such that the first electronic element 22 is exposed from the cladding layer 26.

Furthermore, when a plurality of first electronic elements 22 are arranged, a single first bridging element 21 can electrically bridge at least two first electronic elements 22 via the circuit structure 20.

Figure 2D:
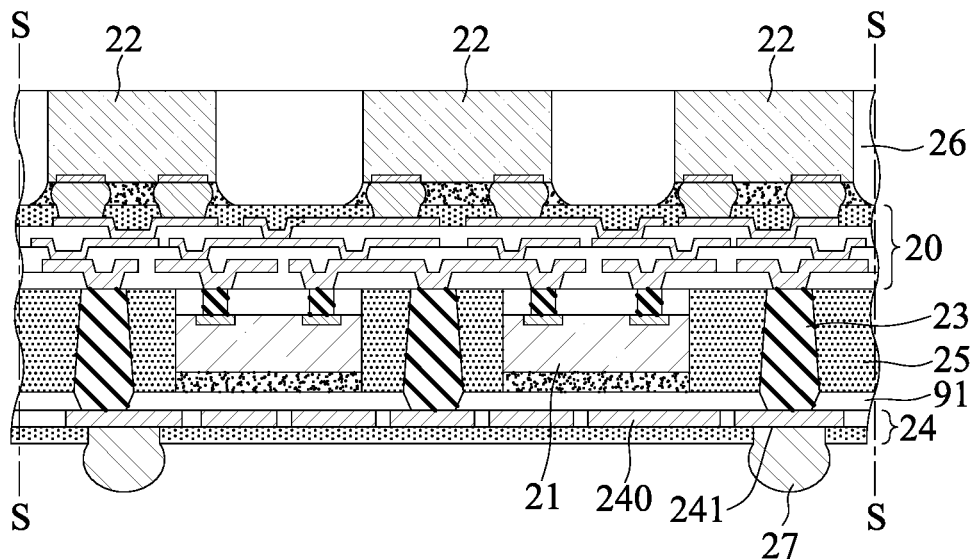

As shown in FIG. 2D, a plurality of conductive bumps 27 such as a plurality of solder bumps or solder balls (its specification is C4 type) are formed on the insulating layer 91, so that the plurality of conductive bumps 27 are electrically connected to the plurality of first conductive pillars 23.

In an embodiment, an RDL process can be performed on the insulating layer 91 to form a circuit portion 24 including conductive traces 240 and external connecting pads 241 for the plurality of conductive bumps 27 to be bonded onto the external connecting pads 241; alternatively, the plurality of conductive bumps 27 can also be directly bonded onto the end surfaces 23b of the plurality of first conductive pillars 23.

Figure 2E:
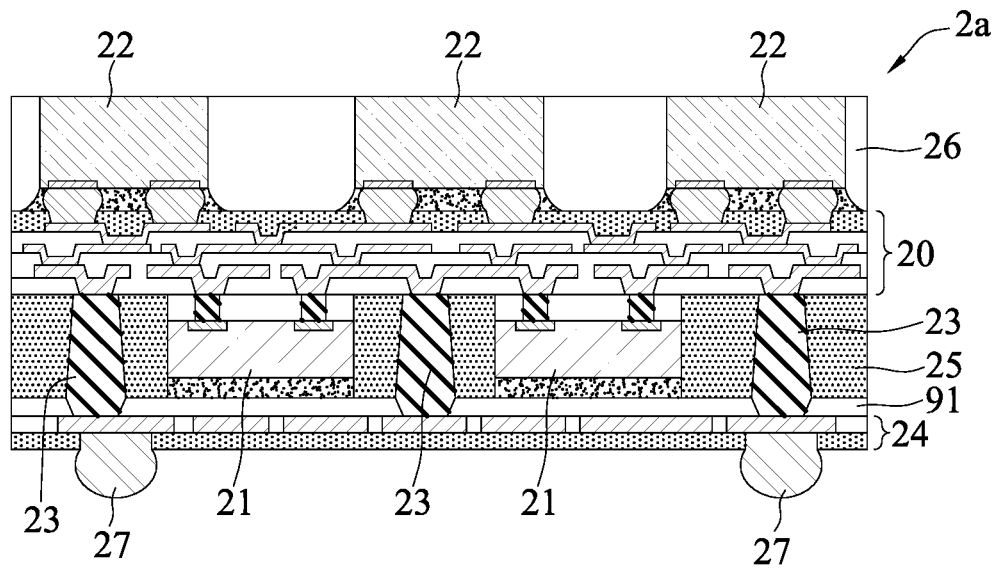

As shown in FIG. 2E, a singulation process is performed along a cutting path S shown in FIG. 2D to obtain a plurality of chip packaging modules 2a.

Figure 2F:
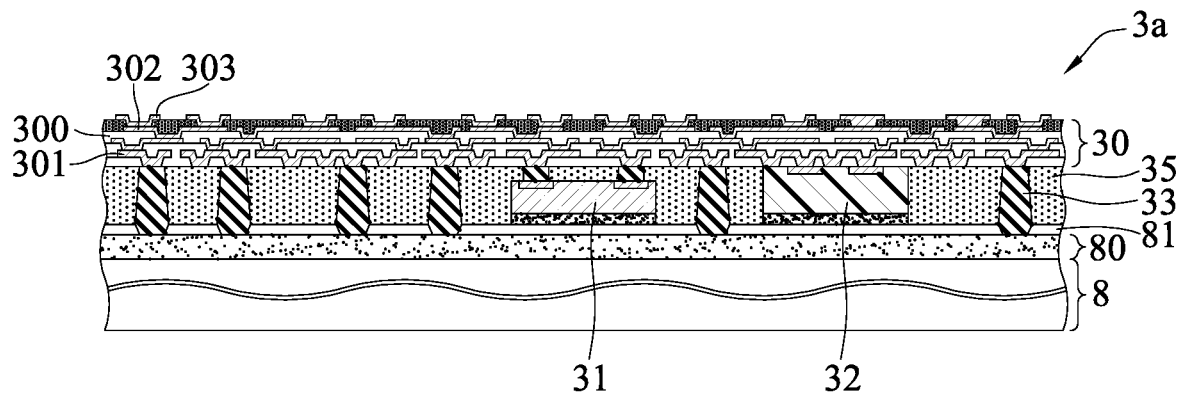

As shown in FIG. 2F, a carrier component 3a of a panel specification or a wafer level specification is fabricated on a support board 8. In an embodiment, a manufacturing process of the carrier component 3a can be as shown in FIGS. 2A to 2B, so the carrier component 3a includes at least one second bridging element 31, at least one third bridging element 32 and a plurality of second conductive pillars 33 disposed on the support board 8, and a second packaging layer 35 covering the second bridging element 31, the third bridging element 32 and the second conductive pillars 33 is formed, and a routing structure 30 is formed on the second packaging layer 35.

The support board 8 has a release layer 80 and an insulating layer 81 such as a dielectric material or a solder resist material in sequence to combine the second bridging element 31, the third bridging element 32, the second conductive pillars 33 and the second packaging layer 35.

The routing structure 30 includes at least one insulating layer 300 and at least one redistribution layer (RDL) 301 bonded with the insulating layer 300, and the outermost redistribution layer 301 has a plurality of electrical contact pads 302 such as micro pads (μ-pads). Further, an under bump metal (UBM) layer 303 can be formed on each of the electrical contact pads 302.

In an embodiment, the material for forming the redistribution layer 301 is copper, and the material for forming the insulating layer 300 is such as polybenzoxazole (PBO), polyimide (PI), prepreg (PP), or other suitable dielectric materials, and the redistribution layer 301 and the insulating layer 300 may be formed by a redistribution layer (RDL) process.

The second bridging element 31 is a semiconductor chip structure, and is electrically connected to the redistribution layer 301.

The third bridging element 32 is a semiconductor chip structure, and is electrically connected to the redistribution layer 301.

The second conductive pillars 33 are metal pillars such as copper pillars or pillars containing a solder material, which are electrically connected to the redistribution layer 301 and are spaced apart from the second bridging element 31 and the third bridging element 32.

The second packaging layer 35 is an insulating material, such as polyimide (PI), dry film, encapsulant such as epoxy resin, or molding compound.

In an embodiment, the second packaging layer 35 can be formed on the support board 8 by liquid compound, injection, lamination, or compression molding.

Furthermore, the surface of the second packaging layer 35 can be flush with the end surfaces of the plurality of second conductive pillars 33 by a leveling process, such as polishing, so that the end surfaces of the second conductive pillars 33 are exposed from the surface of the second packaging layer 35. It should be understood that the second bridging element 31 and the third bridging element 32 may be exposed or not exposed from the surface of the second packaging layer 35 according to requirements.

Furthermore, the material of the second packaging layer 35 and the material of the first packaging layer 25 may be the same or different. For example, the first packaging layer 25 has a hardness greater than a hardness of the second packaging layer 35.

Figure 2G:
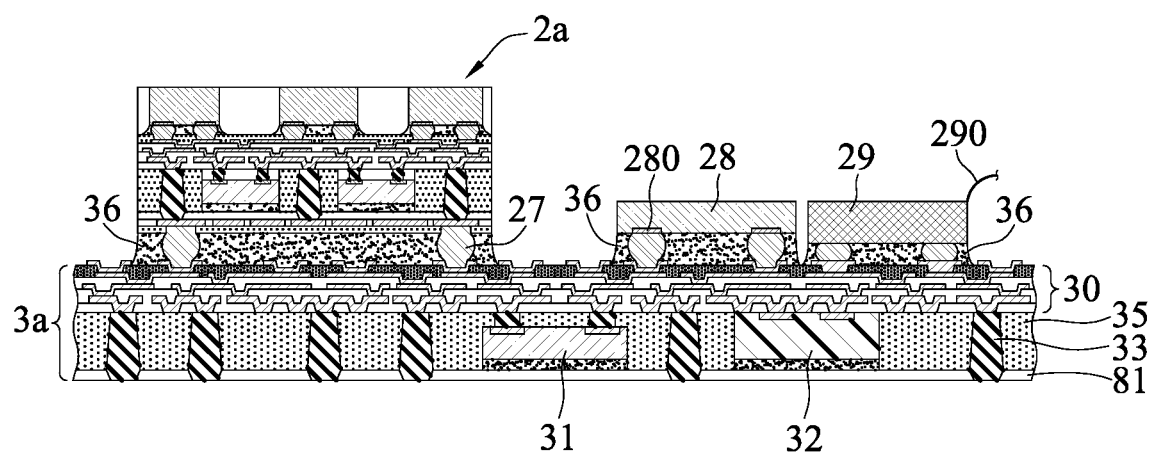

As shown in FIG. 2G, the chip packaging module 2a, a second electronic element 28 and an electronic connector 29 are disposed on the routing structure 30 of the carrier component 3a. Next, the support board 8 and the release layer 80 are removed to expose the end surfaces of the plurality of second conductive pillars 33 of the carrier component 3a.

The chip packaging module 2a is electrically connected onto the routing structure 30 via the conductive bumps 27 thereof.

The second electronic element 28 is a semiconductor chip structure, which has a plurality of contacts 280, and is electrically connected to the routing structure 30 in a flip-chip manner to receive electrical (e.g., digital or analog) signals from the chip packaging module 2a.

The electronic connector 29 is electrically connected to the routing structure 30 by, for example, soldering, so as to receive electrical (e.g., digital or analog) signals from the second electronic element 28.

In an embodiment, the electronic connector 29 is provided with a signal transmission line 290 for connecting to an external device (not shown), so as to transmit the signals to the external device such as other packages. It should be understood that an underfill 36 can be formed as required to fix the chip packaging module 2a, the second electronic element 28 and the electronic connector 29.

Furthermore, the second bridging element 31 electrically bridges the chip packaging module 2a and the second electronic element 28, and the third bridging element 32 electrically bridges the second electronic element 28 and the electronic connector 29, so that the second electronic element 28 can receive the electrical signals from the chip packaging module 2a via the second bridging element 31 and the routing structure 30, and the electrical signals are transmitted to the electronic connector 29 via the routing structure 30 and the third bridging element 32, so that the electronic connector 29 transmits the electrical signals to the external device.

Figure 2H:
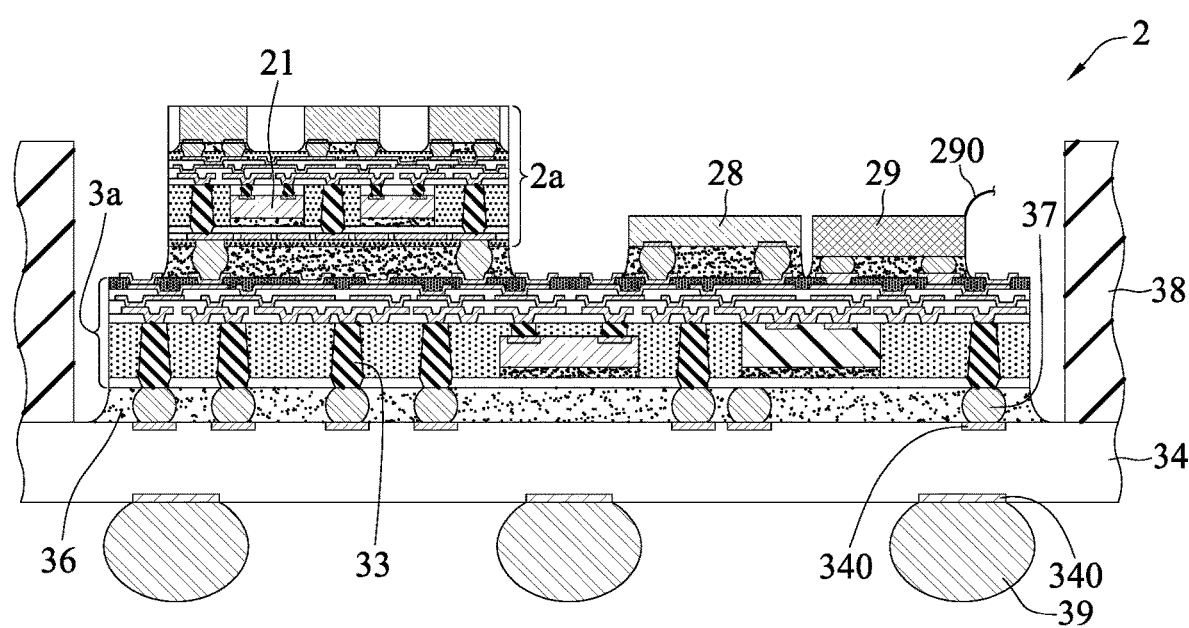

As shown in FIG. 2H, then a plurality of conductive elements 37 electrically connected to the second conductive pillars 33 are formed on the insulating layer 81 of the carrier component 3a, and then a singulation process is performed, and the carrier component 3a can be stacked on a substrate structure 34 via the conductive elements 37.

The substrate structure 34 is, for example, a package substrate with a core layer or a coreless package substrate, which is configured with at least one routing layer 340.

The conductive elements 37 are metal bumps containing a solder material, which are electrically connected to the routing layer 340 of the substrate structure 34, and the conductive elements 37 can be covered by the underfill 36.

In an embodiment, at least one heat sink 38 can be disposed on the upper side of the substrate structure 34 (i.e., the side where the carrier component 3a is arranged), and a ball-placement process may be performed on the routing layer 340 on the lower side of the substrate structure 34 to form a plurality of solder balls 39 for being disposed on a circuit board (not shown).

Therefore, the manufacturing method of the present disclosure mainly increases the signal transmission speed by adding a second electronic element 28 and an electronic connector 29. Therefore, compared with the prior art, the electronic package 2 of the present disclosure can avoid the problem that the communication speed between multiple electronic packages is too slow. For example, on the circuit board, the communication between the plurality of chip packaging modules 2a is electrically transmitted via the signal transmission line 290 without passing through the substrate structure 34, so as to increase the transmission speed. For instance, when the electronic package 2 is applied to electronic products related to artificial intelligence (AI), which require high data rate, gradually increasing bandwidth, and gradually reducing time delay, the excellent applicability of the electronic package 2 can be further highlighted.

Furthermore, as the package size of the electronic package 2 including high-performance computing (HPC) elements needs to increase, the communication between the chip packaging modules 2a can better meet operational requirements.

The present disclosure also provides an electronic package 2 comprising: a carrier component 3a, a chip packaging module 2a, a second electronic element 28 having a plurality of contacts 280, and an electronic connector 29.

The carrier component 3a has a routing structure 30.

The chip packaging module 2a is disposed on the carrier component 3a and is electrically connected to the routing structure 30.

The second electronic element 28 is disposed on the carrier component 3a and is electrically connected to the routing structure 30 to receive electrical signals from the chip packaging module 2a.

The electronic connector 29 is disposed on the carrier component 3a and is electrically connected to the routing structure 30 to receive electrical signals from the second electronic element 28.

In one embodiment, the routing structure 30 includes an insulating layer 300 and a redistribution layer 301 bonded with the insulating layer 300.

In one embodiment, the electronic package 2 further includes a substrate structure 34 for disposing the carrier component 3a.

In one embodiment, the carrier component 3a includes a second packaging layer 35 embedded with a plurality of second conductive pillars 33, so that the routing structure 30 is disposed on the second packaging layer 35 and electrically connected to the plurality of second conductive pillars 33. Further, the chip packaging module 2a includes a first packaging layer 25 embedded with a plurality of first conductive pillars 23 and first bridging elements 21. For example, the first packaging layer 25 and the second packaging layer 35 are disposed on opposite sides of the routing structure 30. In addition, the first packaging layer 25 has a hardness greater than a hardness of the second packaging layer 35.

In one embodiment, the chip packaging module 2a includes a first bridging element 21.

In one embodiment, the electronic connector 29 is provided with a signal transmission line 290 for connecting to an external device.

To sum up, the electronic package of the present disclosure and the manufacturing method thereof are communicatively connected to the chip packaging module via the second electronic element and the electronic connector to improve the signal transmission speed, so the present disclosure can prevent the problem that the communication speed between multiple electronic packages is too slow.

Furthermore, as the package size of the electronic package including the high performance computing element needs to increase, the communication between the chip packaging modules can better meet the operational requirements.

The foregoing embodiments are provided for the purpose of illustrating the principles and effects of the present disclosure, rather than limiting the present disclosure. Anyone skilled in the art can modify and alter the above embodiments without departing from the spirit and scope of the present disclosure. Therefore, the scope of protection with regard to the present disclosure should be as defined in the accompanying claims listed below.

What is claimed is:

1. An electronic package, comprising:
   a carrier component having a routing structure;
   a chip packaging module disposed on the carrier component and electrically connected to the routing structure;
   an electronic element having a plurality of contacts and disposed on the carrier component and electrically connected to the routing structure to receive electrical signals from the chip packaging module; and
   an electronic connector disposed on the carrier component and electrically connected to the routing structure to receive the electrical signals from the electronic element.

2. The electronic package of claim 1, wherein the routing structure includes a dielectric layer and a redistribution layer bonded with the dielectric layer.

3. The electronic package of claim 1, further comprising a substrate structure for disposing the carrier component.

4. The electronic package of claim 1, wherein the carrier component includes a second packaging layer embedded with a plurality of second conductive pillars, such that the routing structure is disposed on the second packaging layer and electrically connected to the plurality of second conductive pillars.

5. The electronic package of claim 4, wherein the chip packaging module includes a first packaging layer embedded with a plurality of first conductive pillars.

6. The electronic package of claim 5, wherein the first packaging layer and the second packaging layer are disposed on opposite sides of the routing structure.

7. The electronic package of claim 5, wherein the first packaging layer has a hardness greater than a hardness of the second packaging layer.

8. The electronic package of claim 1, wherein the chip packaging module includes a bridging element.

9. The electronic package of claim 1, wherein the electronic connector is provided with a signal transmission line for connecting to an external device.

10. A method of manufacturing an electronic package, comprising:
providing a carrier component having a routing structure; and
disposing a chip packaging module, an electronic element having a plurality of contacts and an electronic connector on the carrier component, and electrically connecting the chip packaging module, the electronic element and the electronic connector to the routing structure, wherein the electronic element receives electrical signals from the chip packaging module, and the electronic connector receives the electrical signals from the electronic element.

11. The method of claim 10, wherein the routing structure includes a dielectric layer and a redistribution layer bonded with the dielectric layer.

12. The method of claim 10, further comprising disposing the carrier component on a substrate structure.

13. The method of claim 10, wherein the carrier component includes a second packaging layer embedded with a plurality of second conductive pillars, such that the routing structure is disposed on the second packaging layer and electrically connected to the plurality of second conductive pillars.

14. The method of claim 13, wherein the chip packaging module includes a first packaging layer embedded with a plurality of first conductive pillars.

15. The method of claim 14, wherein the first packaging layer and the second packaging layer are disposed on opposite sides of the routing structure.

16. The method of claim 14, wherein the first packaging layer has a hardness greater than a hardness of the second packaging layer.

17. The method of claim 10, wherein the chip packaging module includes a bridging element.

18. The method of claim 10, wherein the electronic connector is provided with a signal transmission line for connecting to an external device.

* * * * *